(12) United States Patent  
Shen

(10) Patent No.: US 9,185,311 B2  
(45) Date of Patent: Nov. 10, 2015

(54) IMAGE SENSOR WITH A SPLIT-COUNTER ARCHITECTURE

(71) Applicant: Rambus Inc., Sunnyvale, CA (US)

(72) Inventor: Jie Shen, Fremont, CA (US)

(73) Assignee: Rambus Inc., Sunnyvale, CA (US)

( * ) Notice: Subject to any disclaimer, the term of this patent is extended or adjusted under 35 U.S.C. 154(b) by 234 days.

(21) Appl. No.: 13/952,917

(22) Filed: Jul. 29, 2013

(65) Prior Publication Data

US 2014/0034809 A1   Feb. 6, 2014

Related U.S. Application Data

(60) Provisional application No. 61/677,999, filed on Jul. 31, 2012.

(51) Int. Cl.

| H03K 17/78 | (2006.01) |
| H01L 27/00 | (2006.01) |
| H04N 5/335 | (2011.01) |
| H01L 27/146 | (2006.01) |
| H01L 27/148 | (2006.01) |
| H04N 5/374 | (2011.01) |
| H04N 5/378 | (2011.01) |

(52) U.S. Cl.
CPC ............ *H04N 5/3355* (2013.01); *H01L 27/146* (2013.01); *H01L 27/14643* (2013.01); *H01L 27/14806* (2013.01); *H04N 5/374* (2013.01); *H04N 5/378* (2013.01)

(58) Field of Classification Search
CPC ................. H01L 2924/143; H01L 2924/1431; H01L 2924/14335

USPC ................. 250/208.1, 214 R, 214.1, 214 DC; 348/272–283, 294–324, 332, 333.08, 348/335–338; 257/291–294, 414, 431–466
See application file for complete search history.

(56) References Cited

U.S. PATENT DOCUMENTS

| 4,734,782 | A  | * | 3/1988  | Maeshima      | ...... 358/466 |
| 8,022,450 | B2 |   | 9/2011  | Lim           |                |
| 8,334,913 | B2 | * | 12/2012 | Sakurai et al.| ...... 348/241 |
| 2008/0074524 | A1 |   | 3/2008  | Panicacci    |                |
| 2009/0066825 | A1 |   | 3/2009  | Nezaki et al.|                |
| 2009/0212985 | A1 | * | 8/2009  | Kasuga et al.| ...... 341/156 |
| 2010/0079651 | A1 |   | 4/2010  | Lim          |                |
| 2010/0134662 | A1 |   | 6/2010  | Bub          |                |
| 2010/0225796 | A1 | * | 9/2010  | Lim et al.   | ...... 348/308 |
| 2011/0036989 | A1 |   | 2/2011  | Marks et al. |                |

(Continued)

OTHER PUBLICATIONS

Clark, R.N., "Digital Camera: Does Pixel Size Matter? Factors in Choosing a Digital Camera (Does Sensor Size Matter?)" downloaded from www.clarkvision.com/imagedetail/docs.pixel.size.matter/ on Jun. 8, 2011. 36 pages.

(Continued)

*Primary Examiner* — Pascal M Bui Pho  
(74) *Attorney, Agent, or Firm* — Fenwick & West LLP

(57) ABSTRACT

A split-counter architecture is implemented within an image sensor system. A first counter within an image sensor region counts image data from pixel regions within the image sensor region, and outputs the most significant bits of the image data to a second counter external to the image sensor region, reducing the bandwidth required between the image sensor region and the second counter, and reducing the size of the counters within the image sensor region.

16 Claims, 7 Drawing Sheets

(56) References Cited

U.S. PATENT DOCUMENTS

2011/0074995 A1 3/2011 Rafferty et al.
2011/0121421 A1 5/2011 Charbon et al.
2011/0149274 A1 6/2011 Rissa et al.

OTHER PUBLICATIONS

Finkelstein, Hod et al., "STI-Bounded Single-Photon Avalanche Diode in a Deep-Submicrometer CMOS Technology," IEEE Electron Device Letters, vol. 27, No. 11, Nov. 2006. 3 pages.

Fossum, E. R., "What to do with Sub-Diffraction-Limit (SDL) Pixels?—A proposal for a Gigapixel Digital Film Sensor (DFS)," IEEE Workshop on Charge-Coupled Devices and Advanced Image Sensors, Jun. 2005, pp. 1-4. 4 pages.

International Search Report and Written Opinion dated Jan. 28, 2013 in International Application No. PCT/US2012/064177. 14 pages.

L. Sbaiz, F. Yang, E. Charbon, S. Sustrunk, and M. Vetterli, "The Gigavision Camera," IEEE International Conference on Acoustics, Speech and Signal Processing, Apr. 2009, pp. 1093-1096. 4 pages.

Veerappan, C. et al., "A 160×128 single-photon image sensor with on-pixel 55ps 10b time-to-digital converter," 2011 IEEE International Solid-State Circuits Conference Digest of Technical Papers (ISSCC), Feb. 20-24, 2011. 3 pages.

Yang, Feng et al., "Bits from Photons: Oversampled Image Acquisition Using Binary Poisson Statistics", IEEE Transac-tions on Image Processing, vol. 21, No. 4, pp. 1421-1436, Apr. 2012. 16 pages.

\* cited by examiner

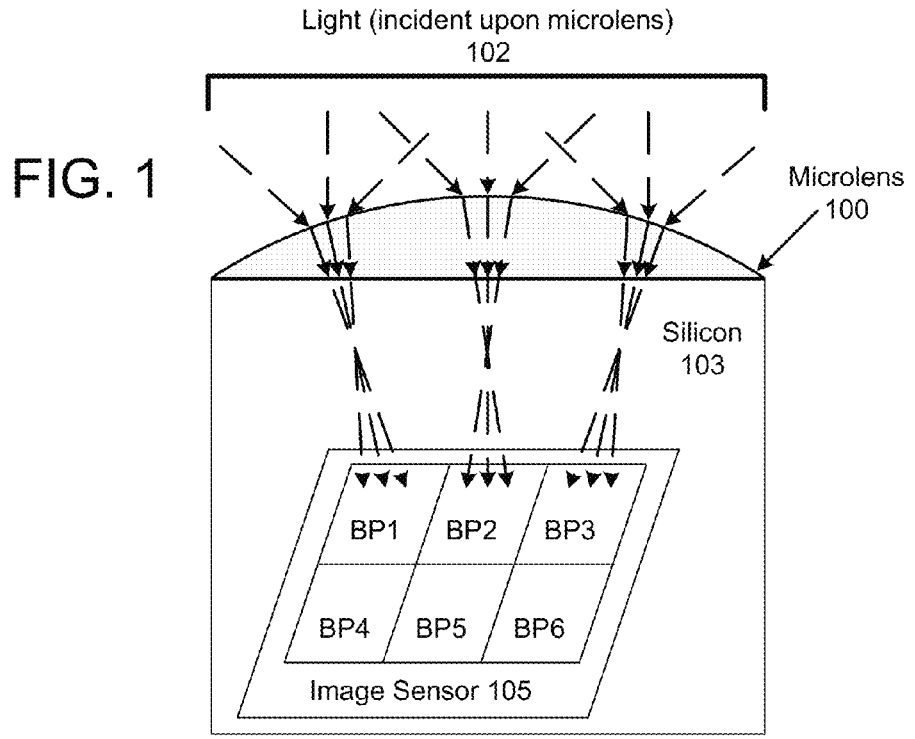
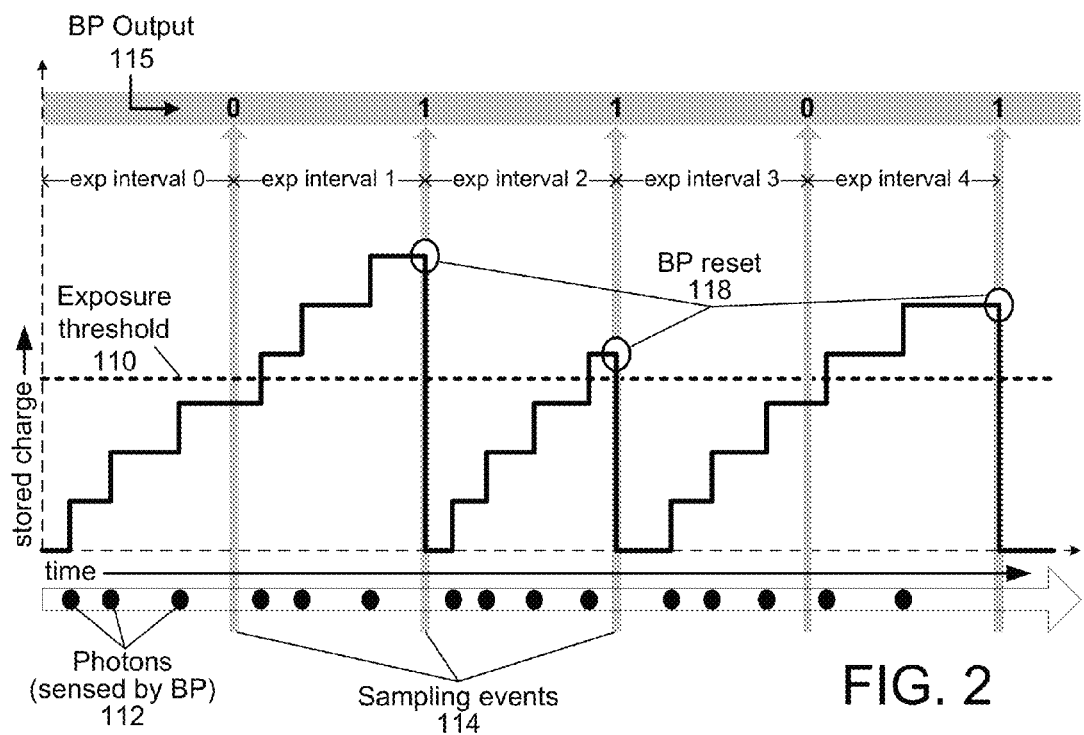

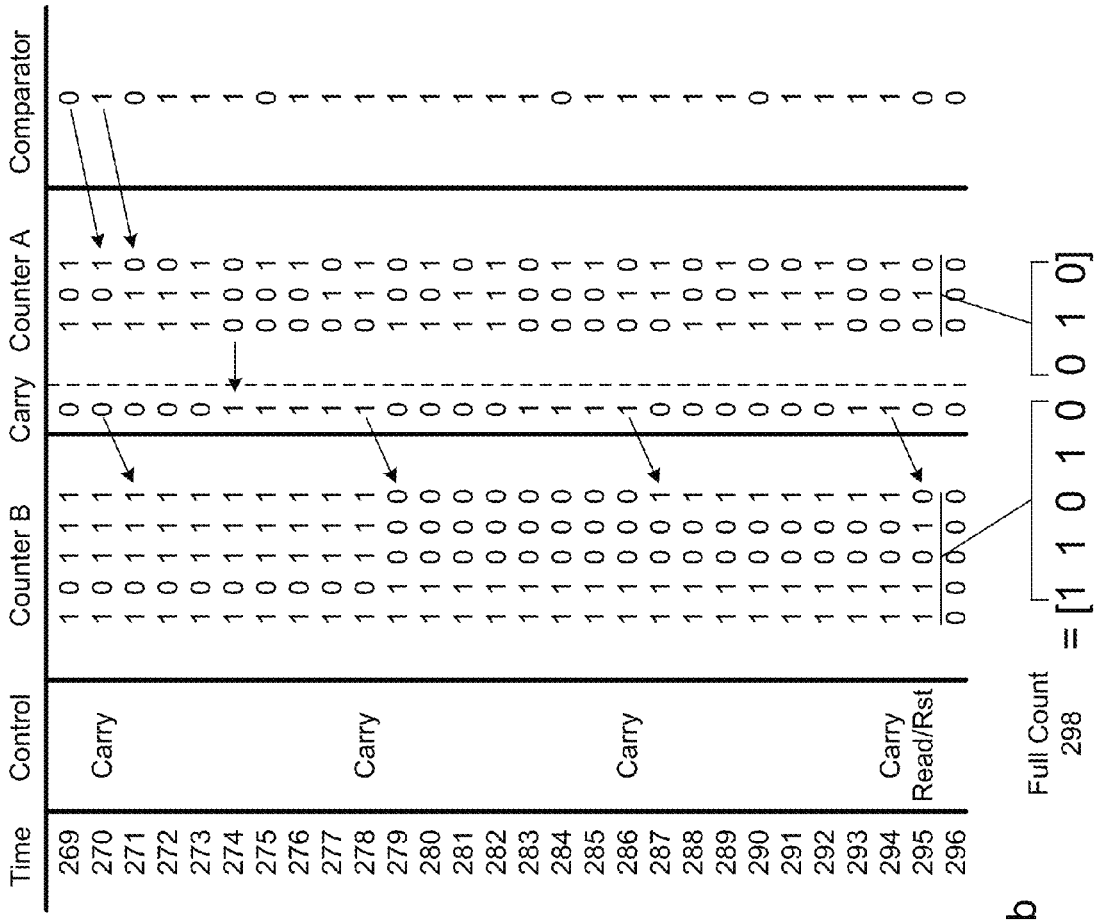
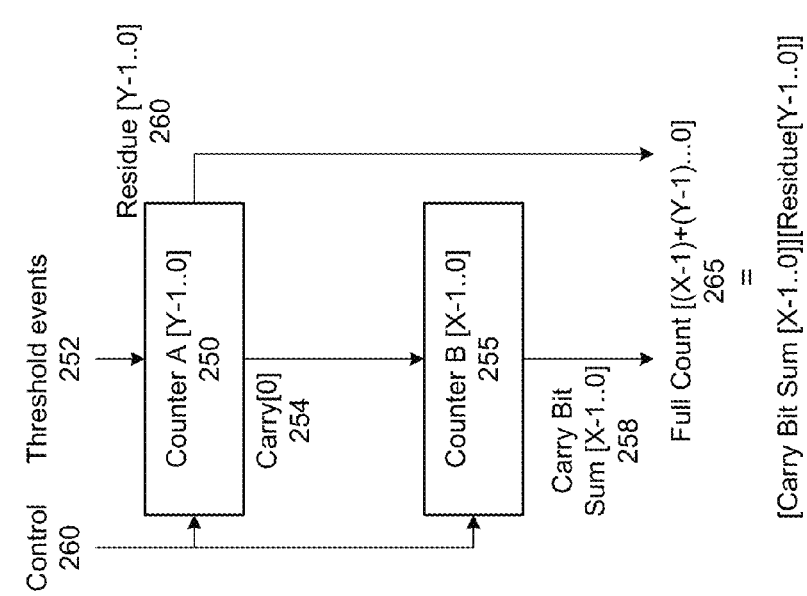
FIG. 6b
FIG. 6a

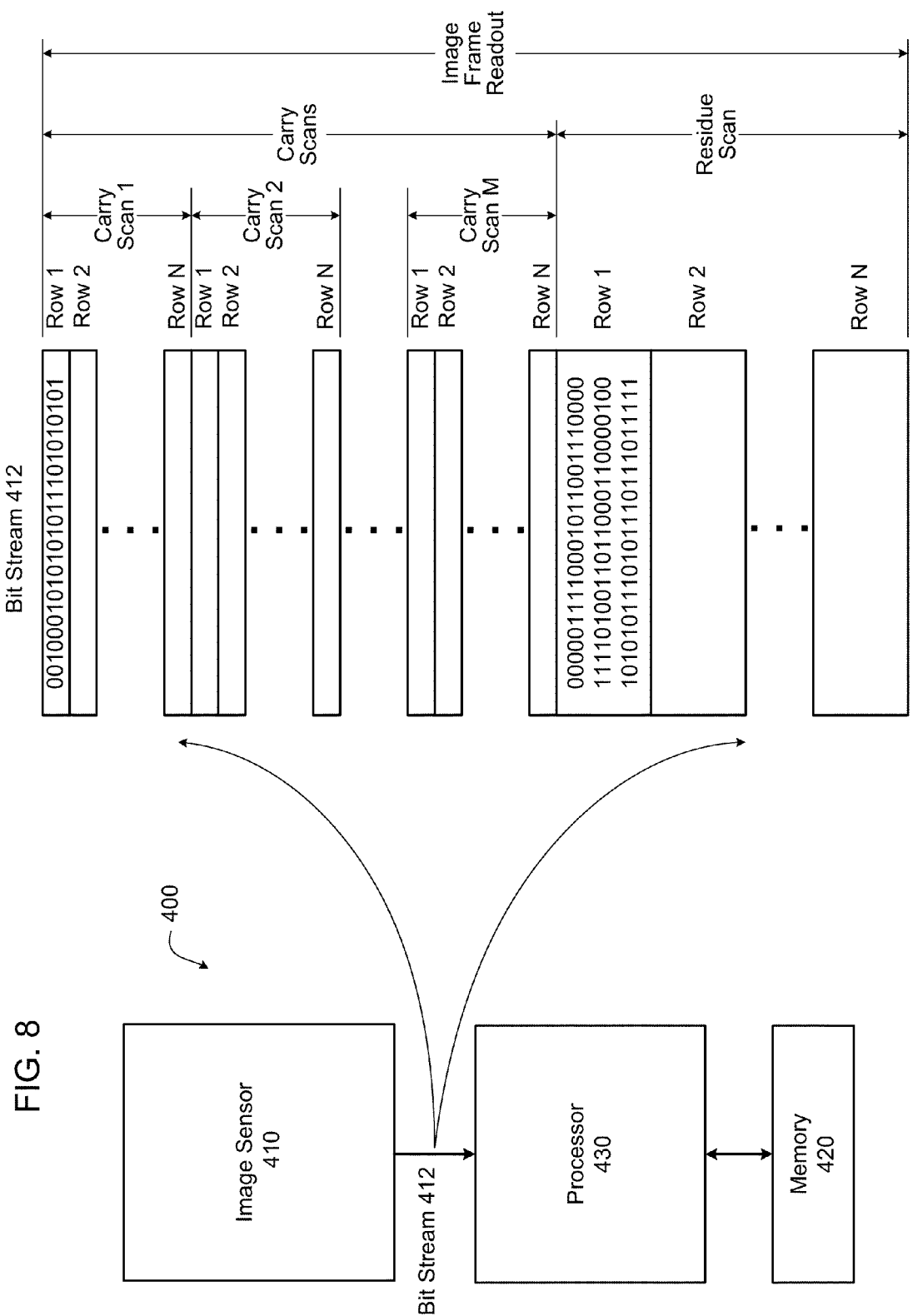

IMAGE SENSOR WITH A SPLIT-COUNTER ARCHITECTURE

CROSS REFERENCE TO RELATED APPLICATIONS

This application claims the benefit of U.S. Provisional Application No. 61/677,999, filed Jul. 31, 2012, which is incorporated by reference in its entirety.

TECHNICAL FIELD

The present disclosure relates to the field of electronic image sensors, and more specifically to a counter architecture for use in such image sensors.

BACKGROUND

Digital image sensors, such as CMOS or CCD sensors, include a plurality of photosensors each configured to convert photons incident upon the photosensors ("captured light") into electric charge. The electric charge can then be converted into image data representing the light captured by each photosensor. The image data includes a digital representation of the captured light, and may be manipulated or processed to produce a digital image capable of display on a viewing device. Image sensors are implemented in integrated circuits ("ICs") with a physical surface that may be divided into a plurality of pixel regions (for instance, one or more photosensors and attendant control circuitry) configured to convert light into an electrical signal (charge, voltage, current, etc.). For convenience, pixel regions within an image sensor may also be referred to as image pixels ("IPs") and the aggregate of the pixel regions or image pixels will be referred to as the image sensor region. An image sensor IC typically will also include areas outside of the image sensor region, for example certain types of control or interface circuitry.

Most CMOS image sensors contain A/D (analog-to-digital) circuitry to convert pixel electrical signals into image data. The A/D circuitry can be one or more ADCs (analog-to-digital converters) located at the periphery of the image sensor region. Particularly for one-bit (binary) quantization, it is also possible to distribute one-bit ADCs within the image sensor region, one per IP or group of IPs.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 1 illustrates light passing through a microlens and incident upon an image sensor according to one embodiment.

FIG. 2 illustrates an example sampling of photons incident upon a binary pixel having a sampling threshold corresponding to four photons in a synchronous environment according to one embodiment.

FIG. 6a illustrates a split-counter architecture according to one embodiment.

FIG. 6b illustrates the operation of a circuit implementing a split-counter architecture, such as the split-counter architecture of FIG. 6a, according to one embodiment.

FIG. 8 illustrates an example of a bit stream format for use in a split-counter architecture, according to one embodiment.

DETAILED DESCRIPTION

Figure 3:
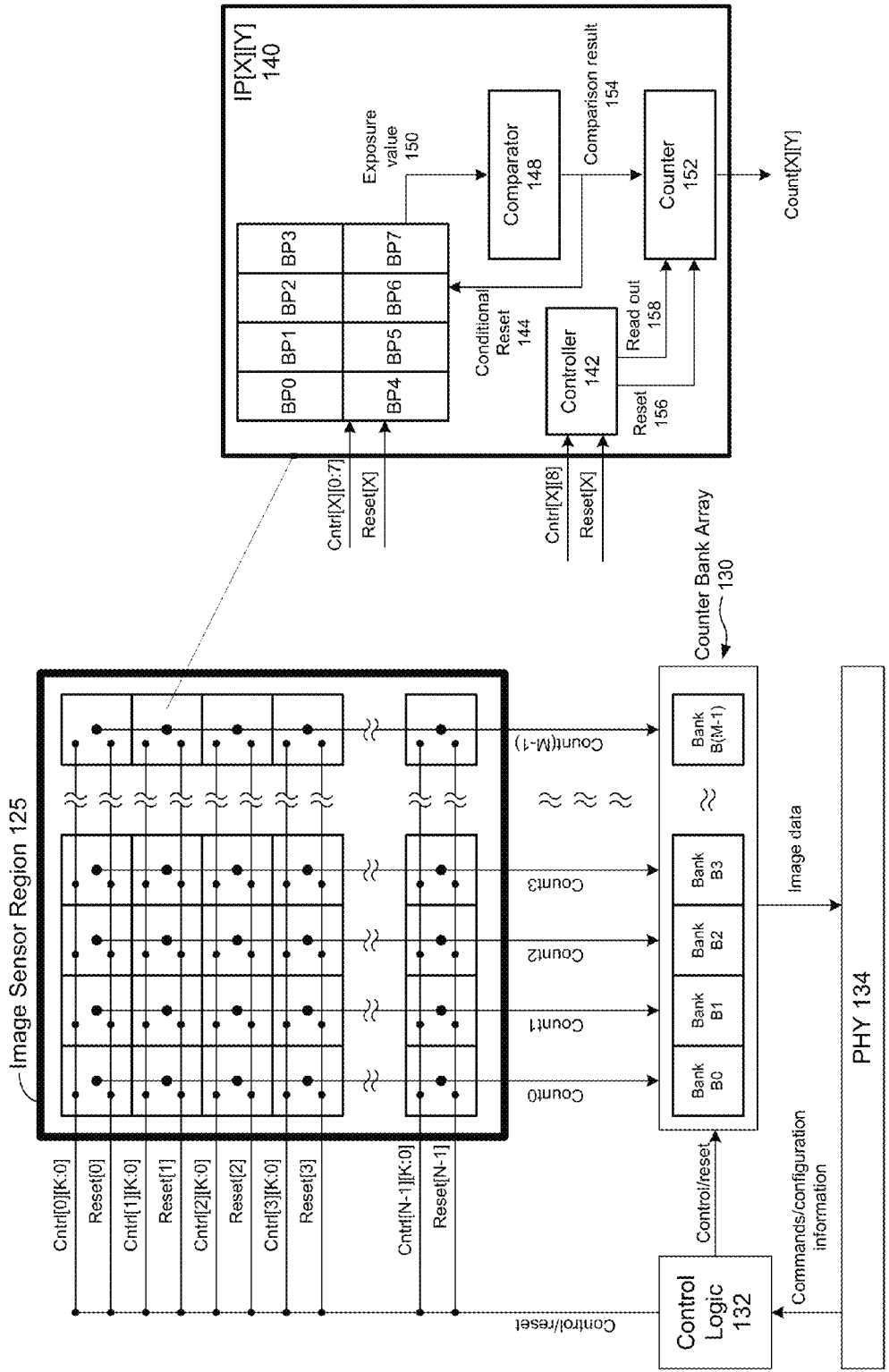
FIG. 3 illustrates an example embodiment of a binary pixel image sensor system having a split-counter architecture, the image sensor system having a first set of counters internal to an image sensor region and a second set of counters external to the image sensor region.

In some image sensors, electrical information representing a photon response from a pixel is converted to a digital image data value by circuitry residing in the image sensor array. This image data is, at some point, transferred from the image sensor region to an area external to the image sensor region. In one approach, the image sensor IC may include registers within the image sensor region itself configured to maintain the image data prior to outputting the image information. For example, each IP may include its own register bank that calculates and/or stores a value indicative of the captured light and, periodically, each IP outputs the image data stored at the register bank to areas external to the image sensor region. However, the inclusion of registers within each IP increases the size of the image sensor region, and may result in a prohibitively large or expensive image sensor IC.

Alternatively, the image sensor may transfer image data without storing (or with only minimal storage of) the image data within the image sensor region. For example, each IP may convert electric charge to image information that is immediately output (e.g., in either analog or digital form) to an entity external to the image sensor region. Such a configuration results in increased throughput requirements to transfer image data from the image sensor region to, for example, a register bank external to the image sensor region. To accommodate this increased throughput requirement, the image sensor must increase the amount of power used to transfer the image data, increase the number of communication lines, or both.

The digital image sensor embodiments described herein utilize a split-register or split-counter architecture to aid in the transporting of image data associated with light captured by an image sensor region to a location external to the image sensor region. The digital image sensor embodiments described herein generally operate in conjunction with an optical system configured to direct imaging light to the image sensor region.

Image Sensor Overview

FIG. 1 illustrates an example image sensor that uses microlenses. The use of microlenses (or other concentrating optics) is optional and is shown here for illustrative purposes only. In FIG. 1, light passes through a microlens and is incident upon an image sensor according to one embodiment. Light 102 incident upon a microlens 100 is directed by the microlens through any intervening material layers (not shown) into a layer of silicon 103 with, e.g., photodiodes forming the light-sensitive portions of an image sensor 105. Though only one microlens is illustrated in the embodiment of FIG. 1, it is to be appreciated that any number of microlenses may be used in conjunction with the image sensors described herein, for instance thousands or millions of microlenses organized in a microlens array. In addition, the lenses used in conjunction with the image sensor described herein are not limited to microlenses, and may also include traditional camera lenses, or any other lens configuration.

The image sensor 105 includes a plurality of BPs ("binary pixels") upon which the light 102 focused by the microlens 100 is incident. The image sensor photodiodes are embedded within a layer of silicon 103. Although conceptually the light is shown as reaching the plurality of BPs, in reality photons are converted to electron-hole pairs in the silicon and the resulting electrons (or holes in alternate embodiments) are collected by the BPs. The description herein will refer to this process as the capture and conversion of light by the BPs into image data for the purposes of simplicity. Each BP of the image sensor represents a portion of the surface area of the image sensor, and the BPs of the image sensor may be organized into various arrays of columns and rows. In a CMOS or CCD image pixel technology, each BP (for instance, each photosensor) converts light incident upon the BP into a charge and includes readout circuitry configured to convert the charge into a voltage or current. In one BP image sensor, each BP readout circuit couples to a comparator configured to, when sampled, compare the voltage or current to a reference and to produce a binary signal indicative of the comparison result. In one embodiment, the light captured by each BP of the image sensor represents one pixel of image data (an image pixel or IP) for an associated digital image, though in other embodiments image data from multiple BPs is combined to represent a fewer number (one or more) digital IPs (downscaling).

The image sensor 105 may include components outside the BP array. Similarly, portions of the BP array may include components that do not convert light into charge. The region defined by the BPs in the aggregate will be referred to as the image sensor region. As described herein, the image sensor may include comparators such as sense amplifiers ("SAs"), controllers, counters, registers, transistors, photodiodes, and the like. In different architectures, some of these components may be located within the image sensor region or external to the image sensor region. In these embodiments, a lens (such as the microlens 100) may be configured to direct light toward the actual light-sensing elements within the BP rather than, for example, on the SAs, controllers, and other components.

As noted above, an image sensor may include multiple IPs, and each IP may include multiple BPs configured to sense light. Each BP, in response to light (for instance, one or more photons), captures a corresponding charge. In an asynchronous environment, when the charge captured by a BP exceeds a charge threshold, the BP outputs a signal indicating that the threshold has been reached. In a synchronous or clocked environment, the BP may be periodically sampled, causing the BP to output a signal indicating whether the charge exceeds the charge threshold.

FIG. 2 illustrates an example sampling of photons incident upon a binary pixel having a sampling threshold corresponding to four detected photons in a synchronous environment according to one embodiment. Photons 112 sensed by a BP (subject to quantum efficiency limitations, i.e., typically not every incident photon will result in a captured charge carrier), with an exposure threshold 110 representing a charge corresponding to four photons, cause the BP to convert the photons to charge. Each photon detected by the BP triggers a corresponding cumulative increase in the charge captured by the BP, shown as positive steps in the charge of FIG. 2 for the purposes of example. The BP is sampled at the sampling events 114, which, for example, may be implemented with a sampling clock signal. Although the BP of FIG. 2 is sampled periodically (resulting in even exposure intervals), in other embodiments the BP is sampled at uneven exposure intervals. For instance, if a light detector determines that the amount of light incident upon the image array increases, a sampling controller coupled to the light detector may decrease the length of the exposure intervals between sampling, and vice versa. It should also be noted that the exposure threshold may vary over time (for instance due to lighting conditions, change in saturation tolerance, to set the dynamic range, or the like), and does not necessarily represent a static threshold. Uneven sampling intervals within a captured frame may also be used to set the dynamic range of the device.

When sampled, the BP of FIG. 2 is configured to output a logic "0" if the cumulative charge generated by the BP does not exceed the exposure threshold 110, and is configured to output a logic "1" if the cumulative charge generated by the BP does exceed the exposure threshold. In the event that sampling the BP results in the BP outputting a 1 (indicating that the charge stored by the BP at the time of sampling exceeds the exposure threshold), the BP is reset. In the event that sampling the BP results in the BP outputting a 0 (indicating that the charge stored by the BP does not exceed the exposure threshold), the BP maintains the accumulated charge for at least the next exposure interval, after which the BP is again sampled. The sampling of a BP accumulated charge exceeding the exposure threshold is referred to herein as a "threshold event." It should be noted that for the remainder of this description, a threshold event will correlate to the subsequent outputting of a logic 1 for the purposes of simplicity. In other embodiments, threshold events result in the outputting of a logic 0 or another signal, and threshold events may be triggered by the failure of a stored charge to exceed an exposure threshold.

The embodiment of FIG. 2 illustrates five exposure intervals. During exposure interval 0, the BP senses three photons. As the charge captured by the BP as a result of these three photon strikes does not exceed the exposure threshold 110, the BP output 115 responsive to the sampling event at the end of exposure interval 0 is 0 and the charge accumulation continues. During exposure interval 1, three additional photon strikes cause the BP to capture additional charge in excess of the exposure threshold. The BP output responsive to the sampling event at the end of exposure interval 1 is 1, indicating a threshold event at the BP, and the BP is reset. During exposure interval 2, four photon strikes cause the BP to again capture charge in excess of the exposure threshold, resulting in an output of 1 in response to the sample event at the end of exposure interval 2 and a resetting of the BP. During exposure interval 3, three photon strikes cause the BP to capture a charge that does not exceed the exposure threshold, resulting in an output of 0 responsive to the sampling event at the end of exposure interval 3. During exposure interval 4, two photon strikes cause the BP to capture additional charge so as to exceed the exposure threshold, resulting in an output of 1 responsive to the sampling event at the end of exposure interval 4 and a resetting of the BP. It should be noted that in operation, any number of exposure intervals (for instance, the five exposure intervals of the embodiment of FIG. 2 or more) may occur during the capture of a single image or video frame or sub-frame. Optionally, at the end of the capture of an image, frame, or sub-frame the charge stored by the BP may be reset despite not exceeding the exposure threshold.

It can be seen in the embodiment of FIG. 2 that the effective integration intervals (the intervals between successive sampling outputs of "1") vary in duration according to the photon flux, extending from a minimum time corresponding to a single exposure interval to a maximum time corresponding to the total number of exposure intervals per image frame period. The number of BP sampling intervals determines the degree of temporal oversampling within a given image frame period, and the variable effective integration interval allows different BPs to respond to different arrival rates in the same frame. BPs, BP sampling, and BP image sensors are discussed in greater detail in co-pending application No. 61/580,189, entitled "Conditional reset temporally oversampled binary pixel image sensor", filed on Dec. 23, 2011, the contents of which are hereby incorporated by reference.

Binary-Pixel Image Sensor System with Split-Counter Architecture

FIG. 3 illustrates an example embodiment of a binary pixel image sensor system 120 having a split-counter architecture. The image sensor system has a first set of counters internal to an image sensor region and a second set of counters external to the image sensor region. The image sensor system 120 of FIG. 3 includes an image sensor region 125, a counter bank array 130, control logic 132, and a physical signaling interface 134. In other embodiments, the image sensor system 120 may include fewer, additional, or different components than illustrated in the embodiment of FIG. 3. In one embodiment, the image sensor system 120 shown in FIG. 3 is implemented as a single IC. A counter in the first set of counters internal to the image sensor region and an associated counter in the second set of counters external to the image sensor region is exemplary of a "split-counter" or "split-counter pair."

For purposes of example, the image sensor system 120 and a host IC (not shown in FIG. 3) communicatively coupled to the image sensor system are assumed to form the primary image acquisition components within a camera (e.g., a still-image or video camera within a mobile device, compact camera, digital SLR camera, stand-alone or platform-integrated webcam, high-definition video camera, security camera, automotive camera, etc.). The image sensor IC and host IC can be more generally deployed alone or together with like or different imaging components within virtually any imaging system or device including without limitation metrology instruments, medical instruments, gaming systems or other consumer electronics devices, military and industrial imaging systems, transportation-related systems, space-based imaging systems and so forth. Operation of the image sensor system generally involves the capture of an image or frame through the exposure of BPs to light, the conversion of stored charge as a result of the exposure into image data, and the outputting of the image data to a storage medium.

The image sensor region 125 includes a N-rows (indexed from 0 to N−1) by M-columns (indexed from 0 to M−1) array of IPs, which are described in greater detail below. Each IP includes an array of K BPs, indexed 0 to K−1. The physical signaling interface 134 is configured to receive commands and configuration information from a host IC (e.g., a general-purpose or special-purpose processor, application-specific integrated circuit (ASIC) or any other control component configured to control the image sensor IC), and is configured to provide the received commands and configuration information to the control logic 132. The physical signaling interface is also configured to receive image data from the counter bank array 130 and to output received image data to the host IC.

The control logic 132 is configured to receive commands and configuration information from the physical signaling interface 134, and is configured to transmit signals configured to manipulate the operations and functionality of the image sensor system 120 generally, and the split-counter pair of the image sensor system specifically, based on the received commands and configuration information. For example, in response to receiving a command to capture an image or frame, the control logic may output a series of exposure signals (configured to cause BPs to sense light) and readout signals (configured to cause the BPs to output image data associated with the sensed light to external counters), enabling the capture of the image or frame by the image sensor system. Similarly, in response to receiving a command to initialize or reset the image sensor IC, the control logic may output reset signals configured to reset each BP, causing each BP to disregard any accumulated charge and purge any stored image data. The control signals produced by the control logic identify particular BPs within an IP for sampling, may control the functionality of comparators associated with IPs, may control various other counter functionality (for example, counter carry bit sampling, counter value outputting, etc.), or may control any other functionality associated with the image sensor IC. The control logic 132 is shown in FIG. 3 as external to the image sensor region 125, but portions of the control logic may be implemented locally within the image sensor region 125.

The control logic 132 outputs control and reset signals for each BP in the image sensor region 125. As illustrated in the embodiment of FIG. 3, each BP in an image pixel IP[X][Y] receives a column-parallel Cntrl[X][Z] signal (corresponding to a "row" select control signal for each BP) and a column- and BP-parallel Reset[X] signal from the control logic to reset the BPs, wherein "X" and "Y" refer to the coordinates of the IP within the image sensor region, and "Z" refers to the coordinates of the BP selected within each IP. Further, each IP receives an additional column-parallel Cntrl[X] [K] signal (to enable readout and counting from the IP) and the column-parallel Reset[X] signal (to reset the counter) from the control logic, where K is the number of binary pixels in each IP. Although the control signal and reset signals received at any given IP are each only 1 bit as indexed in the embodiment of FIG. 3, it is to be appreciated that such an indexing is done for the purposes of simplicity only, and that these signals may in practice be any width or dimension. It should also be noted that in other embodiments, the control logic combines all signals for each IP (for instance, the control and reset signals of FIG. 3) into a single control signal.

An image data bus couples the IPs in each IP column in the image sensor region 125 to a counter bank associated with the IP column within the counter bank array 130. Each IP is configured to output image data produced by the IP to the image data bus, and each counter bank is configured to maintain image data received from each IP in the IP column associated with the counter bank. In the embodiment of FIG. 3, each IP produces image data in the form of a count of threshold events, and each image data bus is labeled "CountX" for the purposes of example. Each image data bus CountX outputs the image data produced from each IP within column X of the IP array. In other embodiments, the IPs of the image sensor region produce different forms of image data, and each image data bus is any width or dimension suitable to accommodate the transport of image data from IP to counter bank.

The counter bank array 130 includes M counter banks, each configured to receive image data from a column of IPs in the image sensor region 125. In one embodiment, each counter bank includes one counter for and associated with each IP in an associated IP column. Each counter in each counter bank of the embodiment of FIG. 3 counts or accumulates image data based on the image data received from an IP, and collectively the counters in the counter bank array maintain this accumulated image data until instructed by the control logic 132 to output the accumulated image data to a host IC. In one embodiment described in greater detail below, in a first output mode, the image data from each IP in the image sensor region includes carry bits from a counter within the IP counting threshold events at the IP, and in a second output mode, the image data from each IP includes the value of the count of threshold events from the IP's counter (referred to herein as the "residue" of the IP counter). In this embodiment, each counter in the counter bank is configured to sum carry bits from an associated IP when the IP is in the first output mode, and is configured to concatenate the carry bit sum with a received count value when the IP is in the second output mode.

The control logic 132 is configured to produce readout signals for the counters in the counter bank array 130, the readout signals configured to cause the counters in the counter bank array to output maintained or accumulated image data, for instance after the capture of an image or a frame of video by the image sensor. The control logic is also configured to produce reset signals configured to reset the counters in the counter bank array such that maintained image data is discarded, and to produce identifying signals configured to identify and differentiate between different types of image data to the counters (such as carry bits and residue counters from threshold event counters).

In one embodiment, producing a readout signal by the control logic 132 for the counters in the counter bank array 130 includes producing a series of signals that identify particular image data received at each counter as the carry bits of a threshold event count, that identify particular image data received at each counter as the residue of a threshold even count, that instruct each counter to concatenate a carry bit sum and residue received at the counters to form a concatenated threshold event count, that instruct each counter to output the concatenated threshold event count, and that instruct the counters to reset all maintained image data after outputting the concatenated threshold event count. The control logic may also be configured to produce pause and resume signals configured to cause the counters to pause and resume counting received image data, respectively, to produce signals for individual counters or counter banks (allowing particular counters or counter banks to be controlled individually), and to produce any other signal necessary to control the functionality of the counters in the counter bank array.

As illustrated in FIG. 3, IP[X][Y] 140 represents an IP in the image sensor IC array, with "X" and "Y" representing the coordinates of the IP within the image sensor IC array. The IP receives control signals and a reset signal from the control logic 132, respectively "Cntrl[X][Z]" and "Reset[X]." The IP outputs image data to the counter bank array 130 as the signal "Count[X][Y]."

The specific IP 140 shown in FIG. 3 includes an array of eight BPs, BP0 through BP7, as well as a shared controller 142, a shared comparator 148, and a shared counter 152. The number and arrangement of BPs in an IP may differ in other embodiments. The controller 142 and the BPs are configured to receive control ("cntrl") and reset signals from the control logic 132. In response to receiving a reset signal, the charge accumulated by each BP in the array of BPs is reset, and the controller produces a reset signal 156 for the counter 152, which in turn resets the image information stored at the counter. In the embodiment of FIG. 3, the image information stored by the counter 152 includes a count of threshold events from the BP array. Once reset, the BPs begin to store charge converted from photons incident on each BP.

Control logic 132 sequentially activates Cntrl[X][0:7] for a row X in order to perform readout and conditional reset operations for each BP in each IP in row X. The timing of the activation is selected to provide a given sampling interval since the BPs were last reset or sampled (and conditionally reset). It is noted that readout operations can occur concurrently for multiple rows X that do not share a comparator, since readout of the BPs places no information on the row-parallel column readout lines. In one embodiment, each BP in the BP array is sampled cyclically, with each BP sequentially outputting the charge stored at the BP to the comparator as the exposure charge 150, for instance by starting at BP0, cycling through to BP7, and then re-starting the cycle from BP0, for multiple cycles. In yet other embodiments, multiple BPs in the BP array may output the charge generated at the BPs during a common binned readout. It should be noted that the sampling and outputting of the stored charge of a BP may refer to the presentation of an electric potential representing the stored charge by the BP, may refer to the outputting of a voltage or current representative of the stored charge by the BP, may refer to the transfer of stored charge from the BP to the comparator, or may refer to any other means of indicating the amount of charge stored by a BP to the comparator. It should also be noted that the BP converts light into charge, but the charge stored at a BP may be either increased or decreased by this generated charge, depending on the circuit configuration of the BP. In an alternative embodiment, instead of the control logic 132 controlling the readout and resetting of individual BPs, the controller 142 controls the readout and resetting of BPs based on received Cntrl[X][Z] and Reset[X] signals.

The comparator 148 is configured to detect threshold events at a sampled BP by, e.g., comparing the charge stored by a sampled BP to a charge threshold, such as the exposure threshold 110 of FIG. 2. The comparator may be a sense amplifier, a differential amplifier, an operational amplifier, a voltage comparator, or any other device configured to compare a charge with a charge threshold such as the exposure threshold. A threshold event is detected when the comparator determines that the charge stored by a sampled BP reaches the exposure threshold. In response to detecting a threshold event, the comparator outputs an indication of the detected threshold event as the comparison result 154 (for instance, by outputting a logic 1). In one embodiment, in response to receiving an indication of a threshold event at a sampled BP from the comparator, the controller resets the charge stored by the sampled BP, though in other embodiments, the comparator may reset the sampled BP, or the sampled BP may reset itself. When the comparator determines that the charge stored by a sampled BP has not reached the exposure threshold, the comparator determines that no threshold event has occurred at the sampled BP, and outputs an indication accordingly (for instance, by outputting a logic 0 as the comparison result). In response to receiving an indication of a lack of a threshold event at a sampled BP, in an exemplary embodiment the controller does not discharge the charge stored by the sampled BP, and the sampled BP continues to integrate photocharge until the next sampling of the BP.

The counter 152 receives and sums the comparison results 154 from the counter, resulting in a count of threshold events detected by the comparator 148, and outputs all or part of the count of threshold events as image data. In the embodiment where the comparator outputs a logic 1 for each detected threshold event, the counter counts the received 1's. The counter may be any size or type of counter, for instance a 4-bit or 10-bit digital counter. In the embodiment of FIG. 3, the counter includes a carry bit output representing a number position one bit more significant than the most significant bit of the counter, and is configured to output a logic 1 on the carry bit output in response to the rollover of the counter (resulting from, for instance, adding a comparison result of 1 to a maintained count of "1111" in a 4-bit counter). In this embodiment, the counter outputs carry bits to an associated external counter in the counter bank array 130. For a k-bit counter, such an embodiment beneficially reduces the bandwidth between an IP and a counter located external to the image sensor region 125 by a factor of $2^k$.

The counter 152 may continuously maintain an outputted carry bit until the carry bit is sampled and cleared by an external counter or other entity. For example, for each carry bit 1 output by the counter, the counter maintains the carry bit 1 on a carry bit output line until the counter receives a clear signal indicating that an external counter has sampled the carry bit output, until the controller 142 indicates that the carry bit output has been sampled, or until a pre-determined time period has passed during which the carry bit output is guaranteed to be sampled (for example, a time period exceeding a periodic sampling interval). The counter may utilize an SR flip-flop to maintain outputted carry bits.

In addition to outputting carry bits, the counter 152 is configured to output the residue value of the counter upon receiving a readout signal 158 from the controller 142, which may produce the readout signal in response to direction from the control logic 132 via the Cntrl[X][Z] signal received by the controller 142. For example, if the value maintained by a 5-bit counter is "10010" when the counter receives a readout signal, the counter outputs "10010", for instance one bit at a time over the course of 5 read cycles. The counter may be configured to output carry bits and residue values on the same output line (as illustrated in FIG. 3), or on different output lines (as will be described in the embodiment of FIG. 5b). In the embodiment where carry bits and residue values are outputted on the same output line, the counter may utilize a multiplexor on the output line to direct the outputting of the carry bits and the residue value on the output line (as will be described in the embodiment of FIG. 5a).

Figure 4:
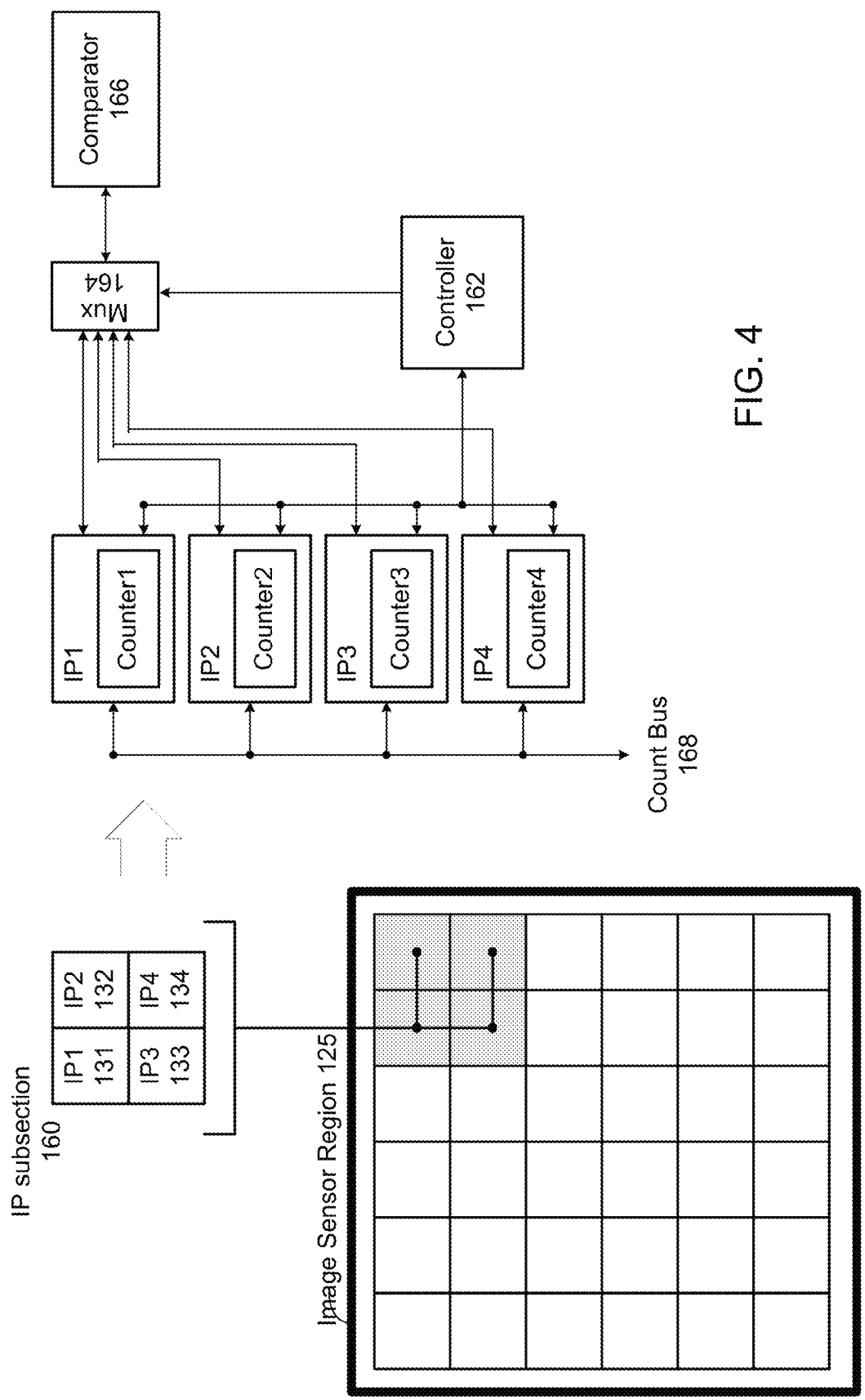
FIG. 4 illustrates an example embodiment of an image sensor using shared controllers and comparator circuitry for subsections of IPs.

FIG. 4 illustrates an example embodiment of an image sensor IC using shared controllers and comparator circuitry for subsections of IPs. In contrast to the embodiment of FIG. 3, in which each IP includes a dedicated controller and comparator, the embodiment of FIG. 4 includes a plurality of IP subsections (such as subsection 160), each including a shared controller 162 and comparator 166. The IP subsections of FIG. 4 each include four adjacent IPs, though in other embodiments, IP subsections may include any number or arrangement of IPs. It should be noted that each IP in IP subsection 160 may include a BP array, for instance, the array of eight BPs illustrated in FIG. 3.

Each IP in IP subsection 160 includes a counter to maintain and output a count of threshold events detected by the IP (for instance, threshold events at a BP array within the IP). The controller 162 samples each IP in the IP subsection by instructing each IP to output a signal representative of charge stored at one or more BPs of the IP to a multiplexor ("mux") 164, and likewise provides a select signal for the mux to instruct the mux to provide the signal representative of the stored charge received from each IP to the comparator 166. For example, the controller may instruct IP1 to output a stored charge signal (such as a signal representative of a charge stored at a BP within IP1) to the mux, and may provide a select signal to the mux such that the received stored charge signal is directed by the mux to the comparator. The controller may specify an individual BP within each IP when sampling each IP. The controller may cycle through and sample all BPs in a sampled IP before sampling the BPs in another IP. Alternatively, the controller may sample one BP per IP before cycling to another IP, and may cycle through IPs until all BPs are sampled. For example, an order of sampling for the controller may be: a first BP from IP1, a first BP from IP2, a first BP from IP3, a first BP from IP4, a second BP from IP1, a second BP from IP2, and so on.

The comparator 166, upon receiving a stored charge signal from the mux 164, is configured to compare the stored charge signal to a threshold, and to output a comparison result to the mux. The mux, upon receiving the comparison result, functions as a de-multiplexor and provides the comparison result to the IP from which the stored charged signal associated with the comparison was received. In one embodiment, the controller 162 provides a select signal to the mux to instruct the mux to provide the comparison result to the correct IP. Alternatively, the comparator may instruct the mux to provide the comparison result to the correct IP, or the mux may determine based on previous select line signals the correct IP to provide the comparison result.

Upon receiving comparison results, each IP maintains the comparison results using a counter internal to or associated with the IP. Each IP in the subsection 160 is configured to output image data, such as carry bits and residue values from the IP's counter, to the count bus 168. Image data from the count bus 168 is received at an associated set of counters external to the image sensor region 125, such as counters in a counter bank array. Each IP of subsection 160 may be associated with one external counter, or all four IPs in subsection 160 may be associated with one external counter configured to count and maintain all image data received from the four IPs.

Split-Counter Operation

Figure 5B:
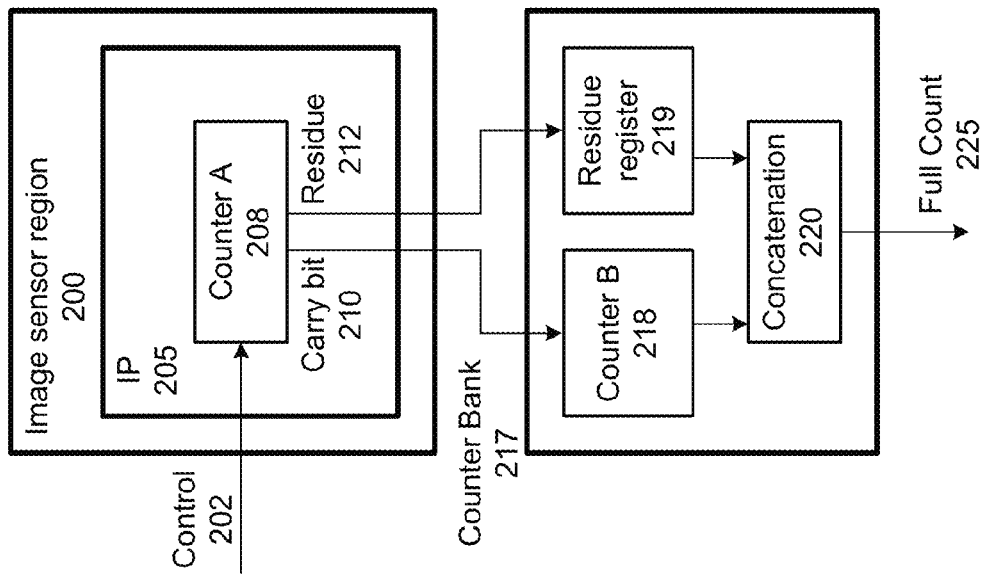
FIG. 5b illustrates an embodiment of an image sensor split-counter architecture with a first counter internal to an image sensor region and a second counter external to the image sensor region, wherein the second counter is configured to receive different portions of image data via separate communication lines but operates without external inputs.
Figure 5A:
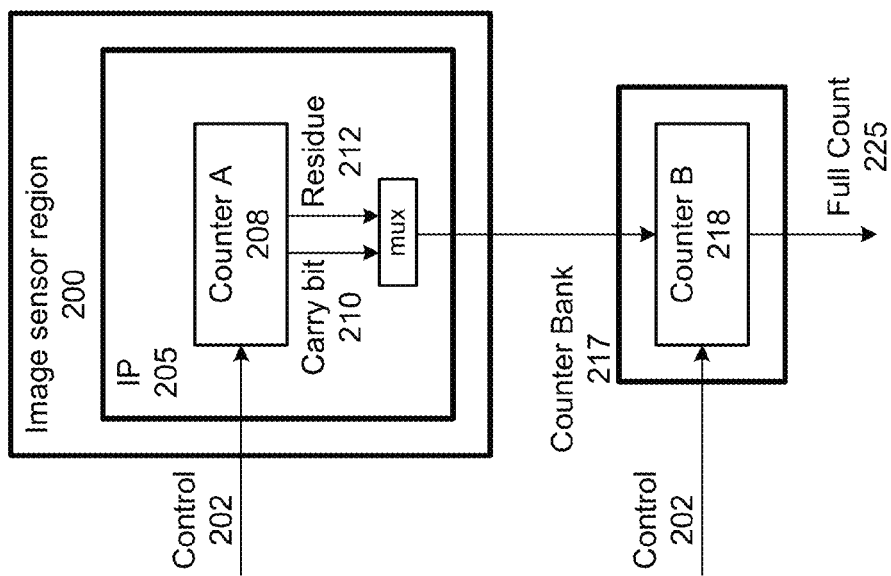
FIG. 5a illustrates an embodiment of an image sensor split-counter architecture with a first counter internal to an image sensor region and a second counter external to the image sensor region, wherein the second counter is configured to receive image data from the first counter via a single communication line but uses external control inputs to differentiate between various portions of image data.

FIG. 5a illustrates an embodiment of an image sensor split-counter architecture with a first counter internal to an image sensor region and a second counter external to the image sensor region, wherein the second counter is configured to receive image data from the first counter via a single communication line but uses external control inputs to differentiate between various portions of image data. The single communication line can be shared by other IPs and Counter Bs, e.g., with the mux in each IP controlling access to the line. The image sensor region 200 includes IP 205, which in turn includes a counter A 208 and a mux. Image data is sent from the counter A to a counter B 218 within a counter bank 217. The counter B is configured to sum image data received from the counter A, and to output the summed image data as a full count 225 when instructed. It should be noted that in one embodiment, the counter A may be the counter 152 of FIG. 3, and the counter B may be a counter in the counter bank array 130 of FIG. 3.

The counter A 208 is configured to receive instructions via the control signal 202, and to operate based on the received instructions. In a first operating mode, the counter A is configured to sum threshold events detected by the IP 205, and to at given times output a carry bit value on the carry bit line 210 to the mux, which in turn outputs the carry bit value to the counter B 218. In a second operating mode, the counter A is configured to output a residue value 212 to the mux, which in turn outputs the residual value to the counter B. The control signal is also configured to indicate the operating mode of the counter A to the counter B, allowing the counter B to differentiate between received carry bits and received residue values.

In one embodiment, the counter B 218 of FIG. 5a shifts received carry bits by a number of bits equal to the size of the counter A 208 prior to counting the received carry bits. For example, if counter A is a 4-bit counter, then the counter B shifts received carry bits from the counter A by 4 bits prior to summing the carry bits or after summing all carry bits. This might be done by actually shifting the bits by 4 places or by aligning the bits with an offset of 4 bits. In this example, when the counter A outputs the 4-bit residue value to the counter B, the counter B may place the received residue value in the four least significant bits of the counter B. Thus, if the counter B is a 12-bit counter, the 8 most significant bits are used to count received carry bits, and the 4 least significant bits are replaced by the received residue value. Alternatively, the counter B may be implemented by a counter configured to count carry bits without shifting and by a register configured to store received residue values, and the carry bit count may be concatenated with the residue value stored in the register to produce the full count, similar to that shown in the FIG. 5b embodiment.

FIG. 5b illustrates an embodiment of an image sensor split-counter architecture with a first counter internal to an image sensor region and a second counter external to the image sensor region, wherein the second counter is configured to receive different portions of image data via separate communication lines but can operate without external shift control. The split counter of FIG. 5b is similar to the split counter of FIG. 5a, though in the embodiment of FIG. 5b, the counter A is configured to output carry bits 210 on a first communication line, and to output residue values 212 on a second communication line.

The carry bits 210 from the counter A 208 are received at the counter B 218, which is configured to count all received carry bits. Each residue value 212 is received at a residue register 219 within the counter bank 217. The carry bit count from the counter B and the residue value stored at the residue register are concatenated in the concatenation circuit 220 (which could be just wires without active circuitry), and the resulting concatenation is output as the full count 225. Separate communication lines for the carry bits and the residue value beneficially allow the counters of the counter bank 217 to differentiate between carry bits and residue values without external shift control, though at a cost of increasing the number of communication lines between the image sensor region 200 and the counter bank. It should be noted that in other embodiments, the counter bank 217 may receive control signals such as the control signal 202, for instance to indicate to the counters of the counter bank when to readout full counts of image data stored by the counters. In addition, it should be noted that the embodiment of FIG. 5b may be implemented without a dedicated concatenation circuit 220. In still other embodiments, carry bits and residues are read into an off-chip memory, with a processor located on or off of the image sensor later reconstructing the number of counts for each IP from the saved values.

FIG. 6a illustrates a split-counter architecture according to one embodiment. In one embodiment, the counter A 250 is the counter 152 of FIG. 3, and the counter B 255 is a counter in the counter bank array 130 of FIG. 3. The counters A and B receive a control signal or signals 260 configured, as described above, to instruct the counters to perform various functions in various operating modes, such as counting image data (e.g. threshold events), outputting and sampling carry bits, outputting and receiving residue values, reading image data for an image capture, or a frame or sub-frame capture, and the like. Based on the received control signals, the counter A receives threshold events 252, and outputs carry bits 254 to the counter B and a residue value 260. The counter B, in response to receiving the control signals, receives and sums the carry bits and outputs a carry bit sum 258.

In the embodiment of FIG. 6a, the counter A 250 is a y-bit counter, and the counter B 255 is an x-bit counter. The counter A outputs 1-bit carry bits 254, a y-bit residue value 260, and the counter B outputs an x-bit carry bit sum. The full count 265 output by the split-counter of FIG. 6a is an (x+y)-bit count representing the concatenation of the x-bit carry bit sum 258 and the y-bit residue value.

FIG. 6b illustrates the operation of a circuit implementing a split-counter architecture, such as the split-counter architecture of FIG. 6a, according to one embodiment. In the example embodiment of FIG. 6b, the counter A is a 3-bit counter, the counter B is a 5-bit counter, and the carry bit output of counter A is sampled by counter B every 8 clock cycles, as indicated by the "Carry" control at times 270, 278, etc. In the time window of FIG. 6b, counter A has a value of "101" and counter B has a value of "10111" at time 269, indicating that both counter A and counter B have counted threshold events prior to time 269.

At time 269, the comparator outputs a 0 to counter A, indicating that a threshold event was not detected by the comparator. Accordingly, the value of counter A remains unchanged from time 269 to time 270. At time 270, the control signal samples the carry bit output of counter A (this sample time may be offset from the comparator update to avoid instability due to a simultaneous update and read of counter A). As the carry bit of counter A at time 270 is 0, the value of counter B remains unchanged from time 270 to time 271. Also at time 270, the comparator outputs a 1 to counter A, indicating that a threshold event was detected by the comparator. Accordingly, the value of counter A increments from time 270 to "110" at time 271.

The comparator next outputs a 1 to counter A at times 272 and 273, resulting in counter A incrementing to "111" and "000" at times 273 and 274, respectively. When counter A rolls over from "111" to "000", counter A outputs a carry bit value of 1 at time 274. The carry bit of counter A remains 1 until the control signal instructs counter B to sample the carry bit line of counter A, at time 278. In response to sampling the carry bit value of 1 at time 278, the counter B increments at time 279 to "11000". By sampling the carry bit at least once for every $2^Y$ comparator updates, the system guarantees that no carry bit update will go undetected by the system.

Counter A again outputs a carry bit value of 1 at time 283 in response to receiving eight values of 1 from the comparator between time 274 and 283 (a time period during which the counter A increments from a value of 000 to the value of 111 before again rolling over to 000). The control signal again instructs counter B to sample the carry bit line of counter A at time 286, and counter B increments at time 287 to "11001" in response. This cycle repeats itself at time 294, when counter B again samples the carry bit line of counter A and increments to "11010" at time 295 in response.

At time 295, the control signal instructs counter A and counter B to readout their counter values, as indicated by the "Read/Rst" control. In response, counter B outputs the value "11010" as the carry bit sum 258 of FIG. 6a, and counter A outputs the value "010" as the residue value 260 of FIG. 6a. The resulting full count value 298 is the concatenation of these two values, "11010010". In addition to instructing the counters to output their counter values, the control signals instructs the counters to reset themselves, resulting in counter A having a value of "000" and counter B having a value of "00000" at time 296.

FIG. 8 illustrates an example of a bit stream format for use in a split-counter architecture, according to one embodiment. In the embodiment of FIG. 8, the split-counter architecture 400 includes an image sensor 410, a memory 420, and a processor 430. The split-counter architecture 400 includes a first set of counters within the image sensor 410 configured to count detected threshold events resulting from charge accumulated by the image sensor. In one embodiment, each counter in the first set of counters is the counter A 208 of FIGS. 5a and 5b, or counter A 250 of FIG. 6a. The image sensor of FIG. 8 includes an N×M array of IPs, and each IP in the IP array is associated with one counter in the first set of counters. As discussed above, instead of a first set of counters, the split-counter architecture may include a first set of registers within the image sensor.

The counters in the first set of counters within the image sensor 410 count threshold events and output threshold event counts as a bit stream 412. Each counter in the first set of counters has one or more carry bits associated with the counter and one or more residue bits associated with the counter. For example, in the embodiment where each counter in the first set of counters is the counter A 250 of FIG. 6a, each counter has one carry bit and Y residue bits. The counters in the first set of counters are readout periodically by controller circuitry not illustrated in FIG. 8. In the embodiment of FIG. 8, during the capture of an image frame, the carry bits of the counters are readout row-by-row for multiple iterations, and the residue bits of the counters are readout row-by-row once per row per image frame. The readout of the carry bits for each counter in the first set of counters is referred to herein as a "carry scan", and the readout of the residue bits for each counter in the first set of counters is referred to herein as a "residue scan".

The bit stream 412 includes a series of M carry bit scans and one residue scan. The first carry scan reads out the carry bit outputs of the counters in the first set of counters associated with each of the N rows of IPs in the image sensor 410. For instance, the portion of the bit stream associated with IP row 1 during carry scan 1 is "0010001010101011101010101", which represents the carry bit outputs of the counters in IP row 1 during carry scan 1. The bit stream portion associated with each row in the IP array during each of the M carry scans is subsequently output from the image sensor to the processor 430, beginning with row 1 during carry scan 1, followed by each of rows 2 through N, followed by rows 1 through N during carry scan 2, and through rows 1 through N during carry scan M. In the embodiment of FIG. 8, the rows of the IP array are scanned sequentially during the M carry scans, though in other embodiments, the rows may be scanned in other orders.

After the M carry scans, the residue bits of the counters in the first set of counters are scanned row-by-row. In the embodiment of FIG. 8, each counter includes three residue bits, and the residue scan reads out the residue bits of each counter in row 1, followed by the residue bits of each counter in row 2, and followed by rows sequentially through row N. The bit stream 412 for an image frame readout thus includes the readout carry bits for each of the M carry scans and the readout residue bits for the residue scan.

The bit stream 412 can be stored by the processor 430 in the memory 420 for later post-processing. In one embodiment, the memory includes a second set of counters configured to determine shifted sums of the carry scan portions of the bit stream, and to concatenate the residue scan portion of the bit stream to the shifted sums at the end of each image frame readout. Alternatively, the processor 430 can be configured to determine the shifted sums of the carry scan portions of the bit stream on the fly, for instance by maintaining bit stream counts at the processor without the use of the memory, and to concatenate the residue scan portion of the bit stream to the shifted sum at the end of each image frame readout. In either embodiment, the processor is configured to, for each image frame, receive the bit stream as the outputs of a series of carry scans followed by a residue scan, and to produce a multi-bit image for the image frame based on the received bit stream. The multi-bit image can subsequently be stored by the processor at a computer memory, for instance the memory 420 or another memory.

Alternative Embodiments

Many alternative embodiments of the image sensor system 120 of FIG. 3 may be implemented. Although the communication lines to and from each IP of FIG. 3 are generally shown to be one-bit wide, in practice the communication lines may be any size. For example, each control or reset signal from the control logic 132 for any given IP may be multiple bits wide, and may specify multiple commands, may include conditional statements, and the like. Similarly, the communication lines within each IP may be any size or width. Finally, the count signals from each IP to the counter bank array 130 may be multiple bits wide. In such an embodiment, the counter 152 may output multiple most-significant bits instead of one carry bit. For example, the counter 152 may be 6-bits wide, and may output the value of the three most significant bits on a 3-bit output line periodically or when otherwise prompted. The counter 152 may be configured to output multiple residue value bits simultaneously instead of 1 bit at a time. Continuing with the previous example, the 6-bit counter's three most significant bits are outputted as carry bits, leaving 3 residue bits, which can be (when prompted) output simultaneously on the 3-bit output line.

Although the image sensor of FIG. 3 is a BP image sensor, it should be noted that the principles described herein are equally applicable to CCD and CMOS image sensors. In such embodiments, each IP (such as IP 140) may be a photosensor configured to periodically convert stored charge into a multi-bit digital signal using an A/D converter. In these embodiments, the counter 152 is configured to sum all received multi-bit digital signals. The A/D converter may produce a digital signal of any size, for instance a signal 6-bits wide. The counter periodically outputs the most significant bits of the counter (for instance a carry bit or multiple most-significant bits) to the external counters in the counter bank array 130, and (when prompted) outputs the residue value from the counters to the external counters.

Instead of using counters within the IPs of the image sensor region 125 and within the counter bank array 130, the image sensor region system 120 may use accumulators or any other registers or circuitry capable of maintaining received image data resulting from the exposure of IPs. For example, the counter 152 of IP 140 may be replaced by accumulator circuitry configured to store and accumulate received comparison results and periodically output the most significant bits and the residue vales of the accumulator. Such embodiments are discussed in greater detail in FIGS. 7a and 7b.

Figures 7A, 7B:
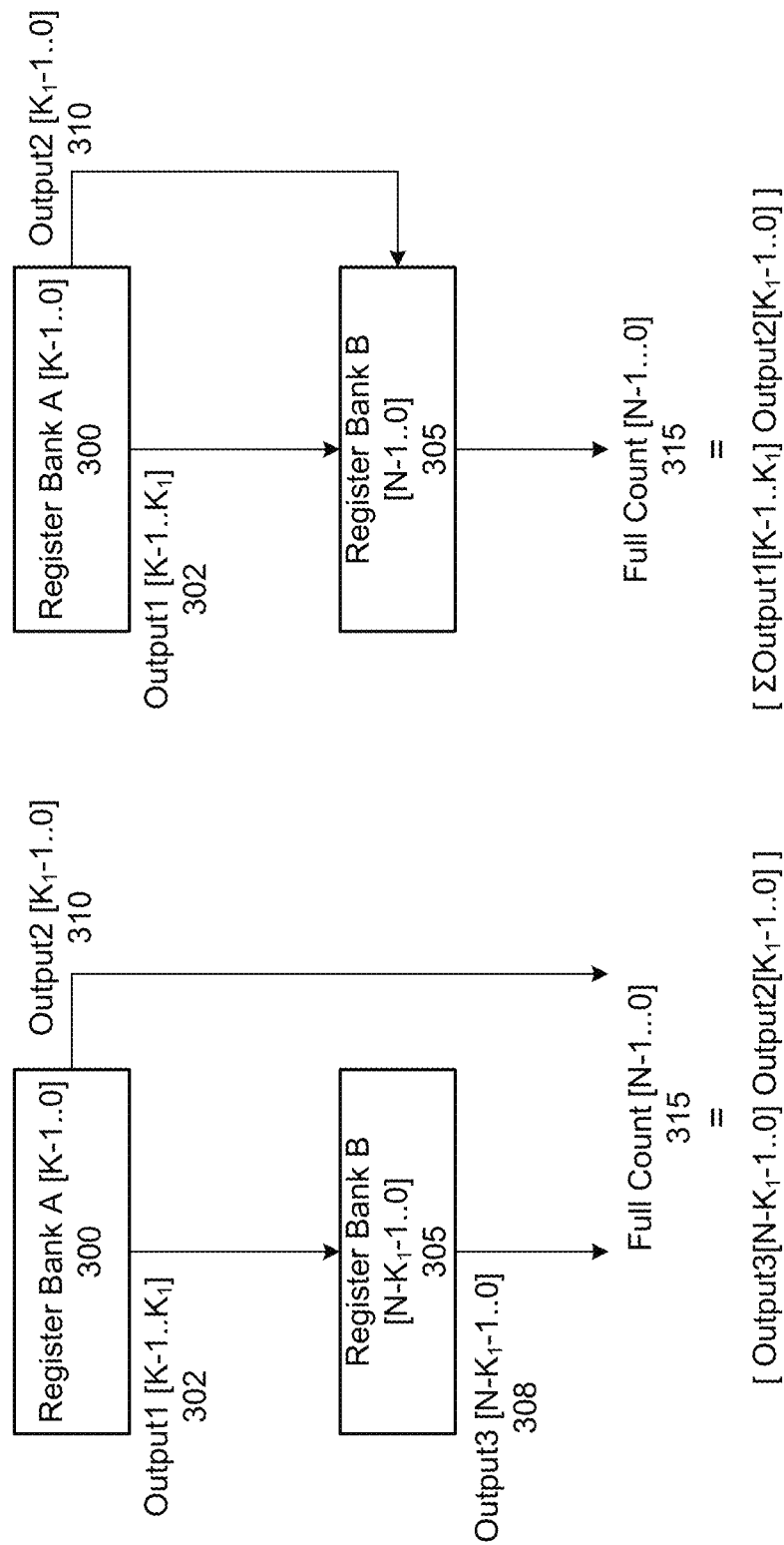
FIG. 7a illustrates a first embodiment of a split-register bank architecture.
FIG. 7b illustrates a second embodiment of a split-register bank architecture.

In the embodiments of FIGS. 7a and 7b, the register banks may include counters, accumulators, or any other circuitry capable of tracking and maintaining received image data. FIG. 7a illustrates a first embodiment of a split-register bank architecture. In the embodiment of FIG. 7a, a register bank A 300 outputs multiple first outputs, Output1 302, to a register bank B 205, and a second output, Output2 310 as a residue value. The register bank B sums or otherwise maintains the multiple outputs of Output1, and outputs a third output, Output3 308, representing the sum. The full count 315 of image data is determined by the external concatenation of Output3 and Output2. The register bank A is K bits wide. Output1 is the most significant $K_2$ bits of the value of register bank A, represented by the width $[K-1 \ldots K_1]$ where $K_2=K-K_1$. Output2 is the least significant $K_1$ bits of the value of register bank A, represented by the width $[K_1-1 \ldots 0]$. Register bank B and Output3 are each $N-K_1$ bits wide. The full count is N bits wide, and is made up of the $N-K_1$ bits of Output3 concatenated with the $K_1$ bits of Output2.

FIG. 7b illustrates a second embodiment of a split-register bank architecture. In the embodiment of FIG. 7b, the register bank A 300 outputs multiple one or more most significant bits of the register bank A as Output1 302 to the register bank B 305, and separately outputs to the register bank B the less significant bits not included in the multiple outputs of Output1 as Output2. The register bank B sums or otherwise maintains the multiple outputs of Output1, and combines this sum with the received Output2 to produce the full count 315. Unlike the embodiment of FIG. 7a, the register bank B of the embodiment of FIG. 7b internalizes the concatenation of the outputs of the register bank A by concatenating the sum of all Output1 values received from the register bank A to the value of Output2 received from the register bank A.

Many alternative embodiments of the image sensor IC of FIG. 4 may be implemented. For instance, each IP subsection can share a controller 162, but may include separate comparators 166. Likewise, each IP subsection can share a comparator 166, but may include separate controllers. The comparator 166 of the embodiment of FIG. 4 can be configured to compare more than one stored charge to a charge threshold at a time. For example, the comparator can be configured to receive one stored charge from each of IP1, IP2, IP3, and IP4, and can simultaneously or near simultaneously compare the four received charges to one or more charge thresholds. The comparator can be configured to receive more than one stored charge from any combination of IPs. For example, the comparator can be configured to receive and compare four stored charges, and may receive all four stored charges from IP1, or may receive two stored charges from IP2, and one each from IP3 and IP4.

In an alternative to the embodiment of FIG. 4, instead of sharing an output bus such as count bus 168, each IP in the IP subsection 160 may include a dedicated output line coupled to an external counter, or may include one each of a dedicated carry bit output line and a residue output line. In another alternative embodiment, instead of multiple IPs sharing controller and comparator circuitry, each IP includes multiple comparators and/or controllers. Such an embodiment may be preferable in instances where each IP includes a large array of BPs, as multiple controllers and comparators may make increase the efficiency of sampling and detecting threshold events over the BP array.

Additional Considerations

It should be noted that the various circuits disclosed herein can be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions can be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions can be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

The section headings in the above detailed description have been provided for convenience of reference only and in no way define, limit, construe or describe the scope or extent of the corresponding sections or any of the embodiments presented herein. Also, various modifications and changes can be made to the embodiments presented herein without departing from the broader spirit and scope of the disclosure. For example, features or aspects of any of the embodiments can be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated-circuit image sensor comprising:
   an image sensor region comprising:
   an array of pixel regions, each pixel region including at least one photosensitive element for detecting light incident upon the pixel region; and
   a plurality of local registers coupled to the pixel regions for storing K-bit values, each K-bit value indicative of the light detected by at least one of the photosensitive elements of a coupled pixel region, the K-bit values comprising K1 less significant bits and K2 more significant bits;
   communication line groups, each communication line group selectably coupled to a plurality of the local registers and configurable to receive the K1 less significant bits and the K2 more significant bits from each of the selectably coupled local registers; and
   a controller coupled to the image sensor region and configured to instruct the local registers to, for each pixel region:
   output the K2 more significant bits on the respective communication line group for that local register and reset the K2 more significant bits; and
   output the K1 less significant bits on the respective communication line group for that local register and reset the K1 less significant bits, wherein the K2 more significant bits are output multiple times for each time the K1 less significant bits are output.

2. The integrated-circuit image sensor of claim 1, wherein each pixel region comprises one or more binary pixels, and the image sensor region further comprises comparators respectively selectably coupled to each pixel region, each comparator configured to sample whether each binary pixel in a respectively coupled pixel region has reached a threshold.

3. The integrated-circuit image sensor of claim 2 wherein, responsive to a determination by the respective comparator that a binary pixel has reached the threshold, the binary pixel is reset and the respective comparator outputs a one-bit value indicative that the threshold has been reached to the respectively coupled local register.

4. The integrated-circuit image sensor of claim 3, wherein each pixel region comprises multiple binary pixels and in at least one operating mode the binary pixels within a pixel region are sampled sequentially by the respective comparator.

5. The integrated-circuit image sensor of claim 1, wherein each photosensitive element comprises a CMOS pixel.

6. The integrated-circuit image sensor of claim 1, wherein each photosensitive element comprises a CCD pixel.

7. The integrated-circuit image sensor of claim 1, wherein each local register comprises a first counter configured to sum values indicative of the light detected by the at least one photosensitive element of the pixel region coupled to the local register.

8. The integrated-circuit image sensor of claim 7, wherein each value indicative of the light detected by the at least one photosensitive element comprises a 1-bit value.

9. The integrated-circuit image sensor of claim 7, wherein each value indicative of the light detected by the at least one photosensitive element comprises an X-bit value, where X>1.

10. The integrated-circuit image sensor of claim 7, wherein the first counter comprises a (K−1)-bit counter with carry bit output, and wherein the (K−1) bits of the counter are the K1 less significant bits and the carry bit output is the K2 more significant bits.

11. The integrated-circuit image sensor of claim 7, further comprising accumulator circuitry coupled to the communication line groups and configured to, for each pixel region:
   receive the multiple outputs of the K2 more significant bits and the output of the K1 less significant bits from the local register for that pixel region;
   sum the multiple outputs of the K2 more significant bits; and
   combine the sum of the K2 more significant bit outputs with the output of the K1 less significant bits to produce an N-bit value.

12. The integrated-circuit image sensor of claim 11, wherein the accumulator circuitry comprises a counter configured to:
   calculate a shifted sum of the received multiple outputs of the K2 more significant bits, the sum shifted by K1 bits;
   wherein combining the sum of the K2 more significant bits with the output of the K1 less significant bits comprises replacing the K1 least significant bits of the counter with the output of the K1 less significant bits.

13. The integrated-circuit image sensor of claim 11, wherein the accumulator circuitry further comprises a K1-bit register configured to store the output of the K1 less significant bits, wherein combining the sum of the K2 more significant bits with the output of the K1 less significant bits to produce an N-bit value comprises concatenating the sum of the K2 more significant bits with the output of the K1 less significant bits stored at the K1-bit register.

14. The integrated-circuit image sensor of claim 1, wherein the communication line group selectively coupled to a given one of the local registers comprises separate communication lines for receiving the K2 more significant bits and receiving the K1 less significant bits from that local register.

15. The integrated-circuit image sensor of claim 1, wherein the communication line group selectively coupled to a given one of the local registers comprises at least one communication line used for receiving the K2 more significant bits and receiving the K1 less significant bits.

16. The integrated-circuit image sensor of claim 15, wherein the controller is further configured to differentiate when the communication line groups are receiving the K2 more significant bits or the K1 less significant bits.

* * * * *